United States Patent [19]

MacDonald et al.

[11] Patent Number: 4,506,151

[45] Date of Patent: Mar. 19, 1985

[54] OPTOELECTRONIC LOGIC

[75] Inventors: R. Ian MacDonald, Ottawa; Elmer H. Hara, Kanata; Robert H. Hum, Ottawa, all of Canada

[73] Assignee: Her Majesty the Queen in right of Canada, as represented by the Minister of National Defence, Ottawa, Canada

[21] Appl. No.: 402,394

[22] Filed: Jul. 27, 1982

[30] Foreign Application Priority Data

Jul. 30, 1981 [CA] Canada ................................ 382915

[51] Int. Cl.³ ............................................. H01J 31/50
[52] U.S. Cl. .................................. 250/213 A; 307/311
[58] Field of Search ............... 307/450, 446, 311, 471, 307/472; 250/213 A; 357/19; 364/845–846, 837

[56] References Cited

U.S. PATENT DOCUMENTS 3,599,000  8/1971  Yanai et al. ..................... 250/213 A
3,696,389  10/1972  Fenner ........................... 250/213 A
3,995,173  11/1976  Sibley ................................. 307/311

Primary Examiner—David C. Nelms
Assistant Examiner—J. Jon Brophy
Attorney, Agent, or Firm—Anthony T. Lane; Jeremiah G. Murray; Edward Goldberg

[57] ABSTRACT

Logic circuits employ photoresponsive GaAs field effect transistors to directly drive GaAs laser diodes to provide optical output signals in response to optical input signals. Since the only electrical inputs are DC bias voltages, each such circuit can be readily decoupled, such as for use in electrically noisy environments. The optical output represents a predetermined logic condition in response to a predetermined operating current applied to the laser diode as a result of the operation of the photoresponsive device. Two photoresponsive devices may be used to apply two different operating current magnitudes to the laser diode to produce two different optical output signals.

13 Claims, 8 Drawing Figures

OPTOELECTRONIC LOGIC

BACKGROUND OF THE INVENTION

1. Field of the Invention

The present invention relates to logic circuits and more particularly to logic circuits which provide optical outputs.

2. Description of the Prior Art

It has previously been proposed by H. F. Taylor in an article entitled "Guided Wave Electro-optic Devices for Logic and Computation", Applied Optics 17, 1978, pp 1493-1498, to provide optical logic elements using the electro-optic effect to produce optical outputs in response to electrical inputs.

Further, high speed, high sensitivity photoresponse has been demonstrated in GaAs FETs as reported by C. Baack, G. Elze and G. Walf, in an article entitled "GaAs MESFET: A High-Speed Optical Detector", Electronics Letters 13, 1977 pp. 193-194; J. J. Pan, "GaAs MESFET For High-Speed Optical Detection", Technical Digest of the 22nd SPIE International Technical Symposium, Aug. 28-31, 1978, San Diego, Calif.; J. C. Gammel and J. M. Ballantyne, "The OPFET: "A New High Speed Optical Detector", Technical Digest of the International Electron Devices Meeting, Dec. 4-6, 1978, Washington, D.C.; and J. M. Osterwalder and B. J. Rickett, "GaAs MESFET Demodultes Gigabit Signal Rates from GaAs Injection Laser", Proc. IEEE 67, pp. 966-967, 1979.

The photosensitivity appears to be due to the modulation of channel conductivity by optically injected carriers. It appears that photodetectors operating by this mechanism can have better high frequency performance than photodiodes and for this reason there is considerable interest in developing Gallium Arsenide field effect transistor photodetectors as receivers in high-speed optical communications systems. The properties of FET photodetectors do not, however, exactly parallel those of photodiodes, so that other uses that are not immediately apparent are also appropriate.

SUMMARY OF THE INVENTION

The present inventors have found that the measured photoresponse of a GaAs FET permits it to drive a heterojunction laser directly, possibly with a small optical gain. Such an arrangement can operate as a new form of logic element with possible advantages over existing types of high-speed electronic logic such as emitter coupled logic, and also over the above-mentioned proposed optical logic elements using the electro-optic effect.

It is accordingly an object of the present invention to provide a novel and advantageous logic circuit capable of providing an optical output in response to an optical input.

According to the invention, there is provided an optoelectronic logic circuit, comprising photosensitive means for detecting at least one optical input; light emitting means for providing an optical output representing a predetermined logic condition in response to a predetermined operating current; and conductor means interconnecting the photosensitive means and the light emitting means in a logic circuit arrangement for applying the predetermined operating current to the light emitting means in dependence on the operation of the photosensitive means.

The present invention further provides an opto-electronic logic circuit, comprising light emitting diode means for providing first and second optical outputs in response to first and second magnitudes of an operating current; semiconductive photodetector means for sensing the presence and absence of at least one optical input; electrically conductive means interconnecting the light emitting diode means and the semiconductive photodetector means in a logic circuit arrangement for applying the first and second operating current magnitudes to the light emitting diode means; means for applying a bias voltage to said semiconductive photodetector means for maintaining the first operating current magnitude through the light emitting diode means; and the first operating current magnitude being at least as great as a threshold value of the operating current sufficient to operate the light emitting diode means and the second operating current magnitude representing a predetermined logic condition sensed by the semiconductive photodetector means.

The invention will be more readily understood from the following description of preferred embodiments thereof given, by way of example, with reference to the accompanying drawings.

DESCRIPTION OF THE PREFERRED EMBODIMENTS

Figure 1:
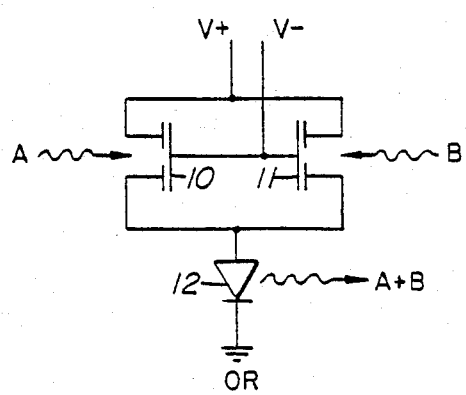
FIGS. 1 to 6 show circuit diagrams of optoelectronic gates in the forms of an OR gate, an AND gate, a NOT gate, a NOR gate, a NAND gate and an EXCLUSIVE OR gate, respectively.
Figure 2:
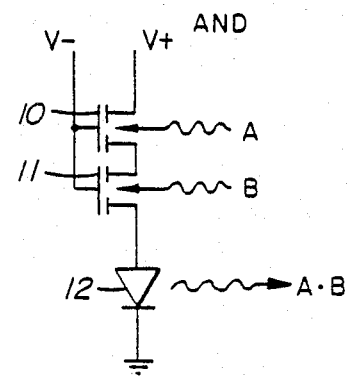
Figure 3:
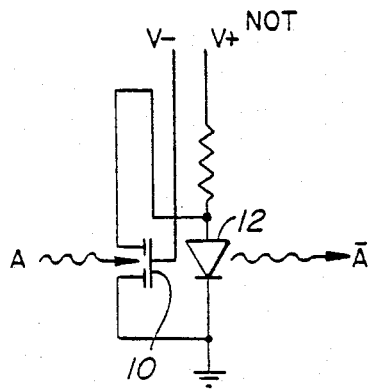
Figure 4:
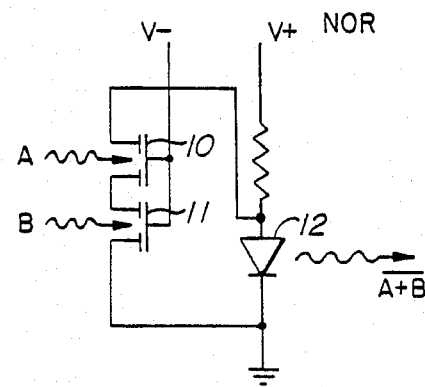
Figure 5:
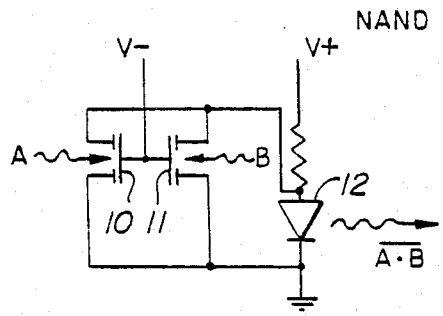
Figure 6:
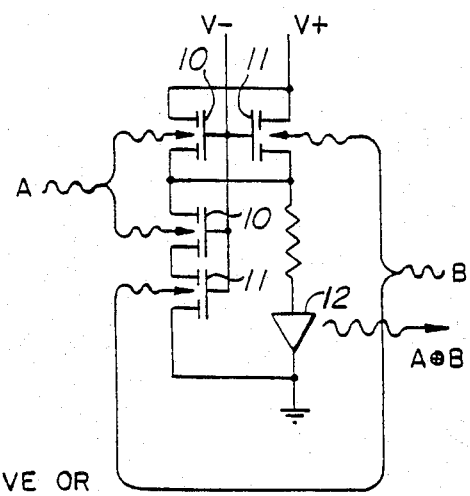

The optoelectronic OR gate embodying the present invention and illustrated in FIG. 1 comprises a pair of photoresponsive GaAS FETs 10 and 11 responsive to optical inputs A and B. The FETs 10 and 11 control the optical power output of a GaAs laser diode 12 and are biased to have channel resistances sufficiently high to keep the laser diode current just above its threshold value when the input light signals or optical inputs A and B are both absent.

When either of the FETs 10 and 11 is illuminated by the respective optical signal A or B, its channel conductance rises and the operating current through the laser diode rises from its first threshold magnitude to a second magnitude, resulting in a corresponding increase of optical power output from the laser diode 12.

The optical power output levels of the diode 12 corresponding to the first and second operating current magnitudes are assigned the values binary 0 and 1, respectively. Thus, the laser diode 12 provides an optical output representing binary 1 in response to illumination of either of the FETs 10 and 11 by the respective input signal A or B.

For convenience, reference numerals 10 and 11 are employed to indicate photoresponsive GaAs FETs, and reference numeral 12 is employed to indicate GaAs laser diodes, in FIGS. 2 to 6, the operations of which will be readily apparent to those skilled in the art and are therefore not described in detail herein. It is, however, noted that in the case of the EXCLUSIVE OR gate shown in FIG. 6, the optical input signals A and B must be sufficiently powerful to permit the two-way power division represented in that figure.

As will also be readily apparent to those skilled in the art, not only can all the basic logic functions be achieved by such apparatus constructed to accept optical input and yield optical output, but also more complex functions can be performed by combinations of the basic gates, or in many cases by specifically designed circuits embodying the optoelectronic logic principles taught herein but using fewer components than would be needed if individual basic logic gates were employed to construct the required functions.

Figure 7:
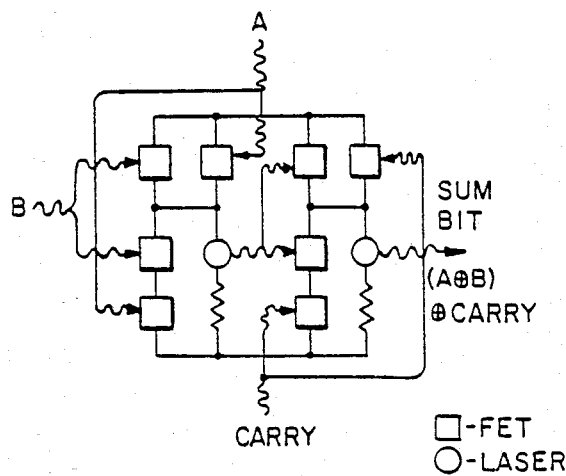
FIGS. 7 and 8 show circuit diagrams of optoelectronic two-bit binary adders.
Figure 8:
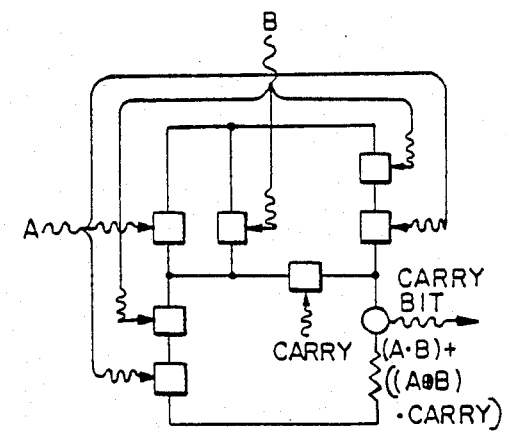

For example, more complex devices, such as two-bit binary adders designed to minimize the number of lasers required, are shown in FIGS. 7 and 8, which illustrate the use of one or two lasers to generate both sum and carry bits by a five-way power division of the optical inputs A and B. These examples show that in principle all logic functions can be constructed from optoelectronic circuits embodying the present invention and also that there is considerable scope for ingenuity in designing the more complex logical devices, so that various optimizations of the circuitry are possible.

Some immediately evident features of present optoelectronic logic circuits are the following. Both the input and the output logic levels are optical, in contrast to the other above-mentioned previously proposed optical logic based on electro-optic devices in which the output is optical, but the input is electrical. Further, the only electrical inputs to the present optoelectronic circuits are direct current bias levels, so that each gate can be electrically decoupled from all other gates simply by placing a suitable bypass capacitor in parallel with the entire gate. Obviously the isolation afforded by purely optical coupling between gates could be of value in electrically noisy environments, or in areas where high fields or voltages can be encountered.

An inherent improvement in efficiency can be gained by eliminating the large (30%) Fresnel reflection at the air-GaAs interface of the FETs 10 and 11 through integrating the FETs 10 and 11 with GaAs waveguides (not shown), which deliver the optical inpus thereto. Photodectectors with integrated optical waveguides have exhibited considerably enhanced quantum efficiencies for radiation introduced via the waveguide as described by J. T. Boyd and C. L. Chen in an article entitled "Integrated Optical Silicon Photodiode Array", Appl. Opt. 15, 1976, pp. 1389–1393. By integrating the laser diodes 12, as distributed feedback devices, the efficiency with which optical power can be delivered into the FETs 10 and 11 can be considerably improved over the case when an air path is involved. Drive-current induced mode hops may be employed to increase the effective differential quantum efficiency for binary modulation.

As well as the advantages of optical distribution of the logic signals that were mentioned previously, the opto-electronic logic gates embodying the present invention may have advantages in speed and, surprisingly, in power consumption over some existing logic types. Both lasers and FETs respond well to signals up to about 3 GHz at present, and there is some evidence that 10 GHz may be possible in future. The gate propagation time of a device such as is shown in FIG. 1 could thus conceivably be between 1 ns and 0.1 ns. A commercially available laser diode (e.g. HLP2600U manufactured by Hitachi Corp.), suitable as the laser diode 12, when driven to its maximum output power, consumes about 10 mW more than at threshold. The energy dissipated in the logic gate of FIG. 1 to transmit a bit is thus less than 10 pJ at 1 GHz, and 1 pJ at 10 GHz. The actual dissipation will be considerably less, because it is not likely that the binary 1 level could be set at the maximum laser output power. On the other hand, a logic gate must dissipate a significant amount of power due to the necessity of biasing the laser above threshold in order to have a fast response. While some reduction in the threshold current of semiconductor lasers may occur with development, we take for comparison purposes the dissipation of the HLP2600U at threshold, which is 40 mW. Such a level is higher, but not unreasonably so, than the dissipation of a known emitter/emitter coupled logic gate, which has 0.5 ns propagation time at 9 mW per gate.

In comparison with known electro-optic logic devices the optoelectronic logic circuits embodying the present invention has advantages. The speeds of both types are the same because both are limited by the speeds of their lasers and photodetectors. However, the electro-optic logic is bulky, electrode lengths being typically millimeters rather than microns, and it requires single mode waveguide of an electro-optic material, which is likely to be optically lossier than the multimode passive waveguide that suffices for the present optoelectronic logic. Since the gates are made of a material different from the optical sources and detectors, complete integration is not possible for electro-optic logic. A power-speed product of 30 pJ has been estimated for a single electro-optic switching element. Since several such elements must be combined to produce a logic gate (they fulfill a role comparable to that of the FETs in the present optoelectronic logic) the gate dissipation at GHz rates is probably even higher than that for the present optoelectronic logic. Furthermore, the dissipation of the optical source, which is still required, must also be included.

The power dissipated by an optoelectronic logic circuit embodying the present invention need not increase with the number of elementary logic gates required to perform the logical functions of the circuit. It is possible in many cases to hold the number of laser diodes 12 required to perform a specific function down well below the number of logical operations needed, as exemplified by the two-bit binary adders shown in FIGS. 7 and 8. In general, the performance of optoelectronic logic can be expected to be better than commercially available fast logic devices.

While several embodiments of the present invention have been illustrated and described, it is apparent that many other variations may be made in the particular design and configuration without departing from the scope of the invention as set forth in the appended claims.

What is claimed is:

1. An optoelectronic logic circuit, comprising:
  photosensitive means for detecting at least one optical input which varies the conductance of said photosensitive means;
  light emitting means for providing an optical output representing a predetermined logic condition in response to a predetermined operating current dependent upon the varying conductance of said photosensitive means;
  conductor means interconnecting said photosensitive means and said light emitting means for applying said operating current to said light emitting means to provide said optical output;

and bias means maintaining a threshold operating current through said light emitting means, said threshold operating current being less than said predetermined operating current but sufficient to maintain a minimum light output from said light emitting means without the occurrence of an optical input.

2. An optoelectronic logic circuit as claimed in claim 1, wherein said photosensitive means comprises at least one photoresponsive field effect transistor.

3. An optoelectronic logic circuit as claimed in claim 1, wherein said photosensitive means comprise at least one GaAs field effect transistor.

4. An optoelectronic logic circuit as claimed in claim 2 wherein said light emitting means comprise a laser diode.

5. An optoelectronic logic circuit as claimed in claim 4 wherein said light emitting means comprise a GaAs laser diode.

6. An optoelectronic logic circuit as in claim 4 including a pair of parallel field effect transistors in series with a laser diode, said transistors being arranged to receive separate optical input signals either of which causes an optical output signal from said diode to provide an OR circuit.

7. An optoelectronic logic circuit as in claim 4 including a pair of series connected field effect transistors in series with a laser diode, said transistors being arranged to receive separate optical input signals which together cause an optical output signal from said diode to provide an AND circuit.

8. An optoelectronic logic circuit as in claim 4 including a single field effect transistor in parallel with a laser diode to provide a NOT circuit.

9. An optoelectronic logic circuit as in claim 4 including a pair of series connected field effect transistors in parallel with a laser diode providing a NOR circuit.

10. An optoelectronic logic circuit as in claim 5 including a pair of parallel field effect transistors in parallel with a laser diode to provide a NAND circuit.

11. An optoelectronic logic circuit, comprising:

light emitting diode output means for providing first and second optical outputs in response to first and second magnitudes of an operating current applied thereto;

light sensitive transistor input means for sensing the presence and absence of at least one optical input, said optical input causing a change in conductance in said transistor;

electrically conductive means interconnecting said light emitting diode means and said light sensitive transistor means for applying said first and second operating current magnitudes to said light emitting diode means, said change in conductance of said transistor causing corresponding changes in said operating current applied to said diode; and means for applying a bias voltage to said light sensitive transistor means for maintaining said first operating current magnitude through said light emitting diode means;

said first operating current magnitude being at least as great as a threshold value of the operating current sufficient to operate sid light emitting diode means and provide said first optical output without the occurrence of an optical input and said second operating current magnitude representing a predetermined logic condition sensed by said light sensitive transistor means resulting in said second optical output from said diode upon the occurrence of said optical input.

12. An optoelectronic logic circuit as claimed in claim 11, wherein in said light emitting diode means comprise a GaAs laser diode and said light sensitive transistor means comprise at least one GaAs field effect transistor.

13. An optoelectronic logic circuit as claimed in claim 11 wherein said light sensitive transistor means includes two field effect transistors respectively applying said first and second operating current magnitudes to said light emitting diode means to produce said first and second optical outputs.

* * * * *